US009991118B2

(12) United States Patent
Kwon et al.

(10) Patent No.: US 9,991,118 B2
(45) Date of Patent: Jun. 5, 2018

(54) HYBRID CARBON HARDMASK FOR LATERAL HARDMASK RECESS REDUCTION

(71) Applicant: Applied Materials, Inc., Santa Clara, CA (US)

(72) Inventors: Thomas Jongwan Kwon, Dublin, CA (US); Rui Cheng, Santa Clara, CA (US); Abhijit Basu Mallick, Fremont, CA (US); Er-Xuan Ping, Fremont, CA (US); Jaesoo Ahn, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/398,591

(22) Filed: Jan. 4, 2017

(65) Prior Publication Data

US 2017/0207088 A1    Jul. 20, 2017

Related U.S. Application Data

(60) Provisional application No. 62/281,046, filed on Jan. 20, 2016.

(51) Int. Cl.
| *H01L 21/033*  | (2006.01) |
| *H01L 21/3213* | (2006.01) |
| *H01L 21/02*   | (2006.01) |
| *H01L 21/308*  | (2006.01) |
| *H01L 21/311*  | (2006.01) |

(Continued)

(52) U.S. Cl.
CPC .... *H01L 21/0338* (2013.01); *H01L 21/02164* (2013.01); *H01L 21/0332* (2013.01); *H01L 21/0335* (2013.01); *H01L 21/0337* (2013.01); *H01L 21/3086* (2013.01); *H01L 21/31116* (2013.01); *H01L 21/31122* (2013.01); *H01L 21/31144* (2013.01); *H01L 21/32136* (2013.01); *H01L 21/32139* (2013.01); *H01L 27/11582* (2013.01); *H01L 28/00* (2013.01);
(Continued)

(58) Field of Classification Search
None
See application file for complete search history.

(56) References Cited

U.S. PATENT DOCUMENTS

| 6,774,033 B1 | 8/2004 | Ben-Tzur et al. |
| 7,939,407 B2 | 5/2011 | Purayath et al. |

(Continued)

OTHER PUBLICATIONS

International Search Report and Written Opinion for International Application No. PCT/US2017/012170 (APPM/023653PCT) dated Jun. 1, 2017.

*Primary Examiner* — Jiong-Ping Lu
(74) *Attorney, Agent, or Firm* — Patterson + Sheridan, LLP

(57) ABSTRACT

Implementations of the present disclosure relate to improved hardmask materials and methods for patterning and etching of substrates. A plurality of hardmasks may be utilized in combination with patterning and etching processes to enable advanced device architectures. In one implementation, a first hardmask and a second hardmask disposed on a substrate having various material layers disposed thereon. The second hardmask may be utilized to pattern the first hardmask during a first etching process. A third hardmask may be deposited over the first and second hardmasks and a second etching process may be utilized to form channels in the material layers.

19 Claims, 2 Drawing Sheets

(51) Int. Cl.
*H01L 27/11582* (2017.01)
*H01L 49/02* (2006.01)
(52) U.S. Cl.
CPC ... *H01L 21/02109* (2013.01); *H01L 21/02115* (2013.01); *H01L 21/02271* (2013.01)

(56) References Cited

U.S. PATENT DOCUMENTS

| | | |
|---|---|---|
| 2004/0259355 A1 | 12/2004 | Yin et al. |
| 2007/0049035 A1* | 3/2007 | Tran .................. H01L 21/0337 438/696 |
| 2008/0081405 A1 | 4/2008 | Jang et al. |
| 2010/0093187 A1 | 4/2010 | Lee et al. |
| 2012/0080779 A1 | 4/2012 | Seamons et al. |
| 2014/0213059 A1 | 7/2014 | Doan et al. |
| 2014/0273462 A1* | 9/2014 | Simsek-Ege ...... H01L 27/11578 438/696 |
| 2016/0013070 A1 | 1/2016 | Jeon et al. |
| 2016/0293609 A1 | 10/2016 | Jha et al. |

\* cited by examiner

HYBRID CARBON HARDMASK FOR LATERAL HARDMASK RECESS REDUCTION

CROSS-REFERENCE TO RELATED APPLICATIONS

This application claims benefit of U.S. Provisional Patent Application No. 62/281,046, filed Jan. 20, 2016, the entirety of which is herein incorporated by reference.

BACKGROUND

Field

Implementations of the present disclosure generally relate to methods and materials utilized in the patterning and etching of substrates. More specifically, implementations described herein relate to a hybrid carbon hardmask.

Description of the Related Art

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is often necessary to use low resistivity conductive materials as well as low dielectric constant insulating materials to obtain suitable electrical performance for such components.

As feature sizes of integrated device patterns decrease, the critical dimension (CD) requirement of features becomes an increasingly important criterion for stable and repeatable device performance. Allowable CD variation across a substrate has also scaled with the scaling of feature CD. With lateral dimensions scaling faster than vertical dimensions, because of issues with device capacitance, high aspect ratios (HAR) are now prevalent within the semiconductor industry.

When such demanding aspect ratios and CD control are compounded with requirements of high etch selectivity, sidewall smoothness, and high tool throughput, the process window for any hardware configuration can become very small. In many situations, a small process window occurs when a number of process gases are incorporated into a complex etchant gas mixture combined with extreme hardware settings, such as very high RF bias powers, to achieve a fragile balance between sidewall passivation, etch rate, and mask selectivity. However, such small process windows typically suffer from performance limitations which cannot be tuned out of the etch process with currently available processes and materials.

Accordingly, there is a need in the art for improved hardmask materials and methods.

SUMMARY

In one implementation, a substrate processing method is provided. The method includes depositing a first hardmask on one or more material layers disposed on a substrate and depositing a second hardmask on the first hardmask. The second hardmask may be patterned and a first etching process may be performed to etch the first hardmask and the second hardmask. A third hardmask may be conformally deposited over the one or more material layers, the first hardmask, and the second hardmask and a second etching process may be performed to etch the one or more material layers to form channels in the one or more material layers.

In another implementation, a substrate processing method is provided. The method includes depositing a first hardmask on one or more oxide and nitride containing material layers disposed on a substrate and depositing a second hardmask on the first hardmask. A first etching process is performed to etch the first hardmask and the second hardmask and a borocarbonitride hardmask is conformally deposited over the one or more oxide and nitride containing material layers, the first hardmask, and the second hardmask. A second etching process is performed to etch the one or more oxide and nitride containing material layers to form channels in the one or more oxide and nitride containing material layers and the second etching process is a plasma based etching process using precursors selected from the group consisting of $CH_4$, $N_2$, $O_2$, and a fluorine-rich precursor.

In yet another implementation, a substrate processing method is provided. The method includes depositing a carbonaceous hardmask on one or more oxide and nitride containing material layers disposed on a substrate and depositing a silicon containing dielectric hardmask on the carbonaceous hardmask. A first etching process is performed to etch the carbonaceous hardmask and the silicon containing dielectric hardmask and a borocarbonitride hardmask is conformally deposited over the one or more oxide and nitride containing material layers, the carbonaceous hardmask, and the silicon containing dielectric hardmask. A second etching process is performed to etch the one or more oxide and nitride containing material layers to form channels in the one or more oxide and nitride containing material layers and the second etching process is a plasma based etching process using precursors selected from the group consisting of $CH_4$, $N_2$, $O_2$, and a fluorine-rich precursor.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
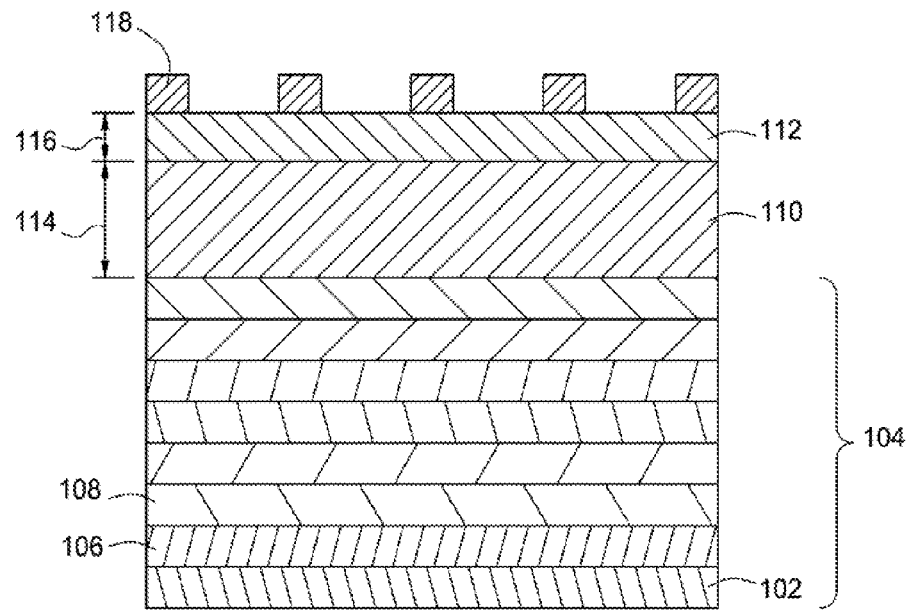
FIG. 1 illustrates a schematic, cross-sectional view of a portion of a substrate having various materials formed thereon according the implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations of the present disclosure relate to improved hardmask materials and methods for patterning and etching of substrates. A plurality of hardmasks may be utilized in combination with patterning and etching processes to enable advanced device architectures. In one implementation, a first hardmask and a second hardmask disposed on a substrate having various material layers disposed thereon. The second hardmask may be utilized to pattern the first hardmask during a first etching process. A third hardmask may be deposited over the first and second hardmasks and a second etching process may be utilized to form channels in the material layers.

FIG. 1 illustrates a schematic, cross-sectional view of a portion of a substrate 102 having various materials formed thereon according to implementations described herein. The substrate 102 may be generally considered an underlying layer which has various materials deposited or otherwise formed thereon. Suitable examples of the substrate 102 include silicon substrates, silicon on insulator (SOI) substrates carbon doped silicon oxides, silicon nitride, silicon carbide, doped silicon, germanium, gallium arsenide, glass, sapphire, and any other materials such as metals, metal nitrides, metal carbides, metal alloys, and other conductive materials, depending on the application. Materials layers 104 may be deposited on the substrate 102. The material layers 104 may include one or more first material layers 106 and one or more second material layers 108. The first and second material layers 106, 108 may be deposited in an alternating arrangement to form a layer stack. The first and second material layers 106, 108 may be formed from various oxide and nitride materials, such as silicon oxide materials and silicon nitride materials. In one implementation, the first material layer 106 may be a silicon nitride material and the second material layer 108 may be a silicon oxide material. In another implementation, the first material layer 106 may be a silicon oxide material and the second material layer 108 may be a silicon nitride material.

The material layers 104 are generally manufactured from materials in an arrangement suitable for forming three dimensional (3D) NAND devices. In one implementation, the material layers 104 may include greater than about 24 material layers, greater than about 32 material layers, greater than about 48 material layers, greater than about 54 material layers, or greater than about 64 material layers. In certain implementations, the disclosure provided herein may be implemented for advanced 3D NAND devices having greater than about 48 material layers.

A first hardmask 110 may be deposited on the material layers 104. The first hardmask 110 may include carbonaceous materials which are suitable for etching by various plasma based etching processes. Suitable materials which may be utilized for the first hardmask 110 include doped and undoped amorphous carbon materials commercially available from Applied Materials, Inc., Santa Clara, Calif., under the trade name Advanced Patterning Film™ (APF). A thickness 114 of the first hardmask 110 may be between about 1 μm and about 2 μm, such as about 1.5 μm. However, it is contemplated that the thickness 114 may be dependent upon desired etching and patterning characteristics with the underlying material layers 104. For example, the first hardmask 110 may be formed or deposited with a thickness dependent on the material's resistance to the process chemistries and conditions used to subsequently etch the material layers 104 while maintaining suitable structural integrity of the first hardmask 110 and/or and the material layers 104.

A second hardmask 112 may be deposited on the first hardmask 110. The second hardmask 112 may be a dielectric material and may have a thickness 116 between about 20 μm and about 200 μm, for example, between about 50 μm and about 100 μm, such as about 80 μm. Similar to the first hardmask 110, the thickness 116 of the second hardmask 112 may be selected depending upon desired performance during subsequent etching processes. In one implementation, the second hardmask 112 may function as a dielectric anti-reflective coating (DARC) and/or improve adhesion of subsequently applied organic films applied by spin on techniques, which may not otherwise adhere well to the first hardmask 110. The second hardmask 112 may be a single film or a multi-layered film stack composed of at least a silicon material. The second hardmask 112 may also include nitrogen and/or oxygen to form a silicon dioxide material, a silicon nitride material, or a silicon oxynitride material. The composition and thickness of the second hardmask 112 may also be tuned to provide minimal reflection and high contrast for desired wavelengths employed during photolithographic patterning of device features.

A photoresist layer 118 may be disposed on the second hardmask 112. The photoresist layer 118 is illustrated as being previously patterned. Suitable patterning techniques include 193 nm photolithography, 193 nm immersion lithography, and extreme ultraviolet (EUV) lithography, depending upon the desired pitch and CD of device features to be formed on the substrate 102. It is also contemplated that double patterning processes, such as self-aligned double patterning (SADP) and self-aligned quadruple patterning (SAQP) processes, may be utilized to pattern the photoresist layer 118. Suitable materials which may be utilized for the photoresist layer 118 include polymers and the like, such as organic polymers, among others.

Figure 2:
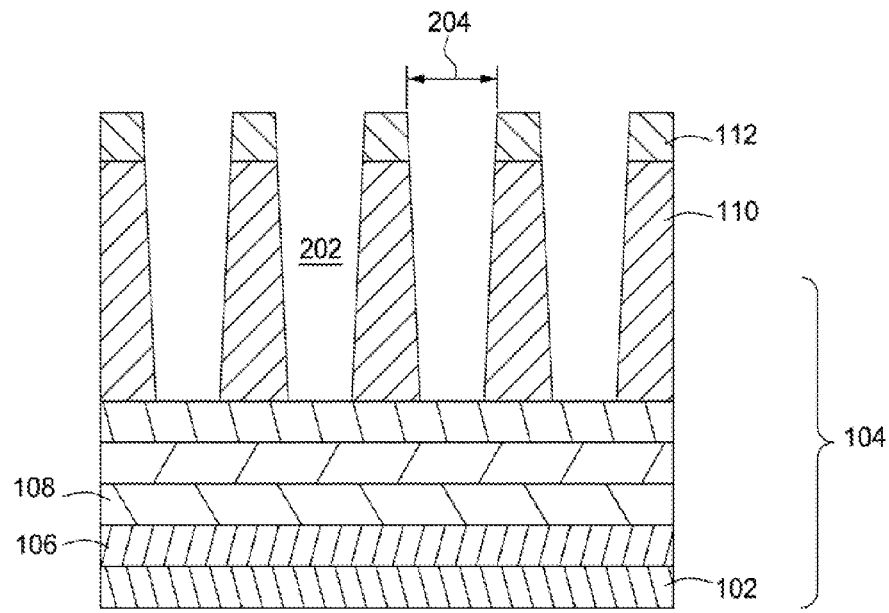
FIG. 2 illustrates a schematic, cross-sectional view of a portion of a substrate after a first etching process according to implementations described herein.

FIG. 2 illustrates a schematic, cross-sectional view of a portion of the substrate 102 after a first etching process according to implementations described herein. The previously patterned photoresist layer 118 generally provides the pattern utilized by the first etching process. In the illustrated implementation, the first etching process may etch the second hardmask 112 and the first hardmask 110 for form recesses 202 between adjacent portions of the first hardmask 110. The first etching process may be a plasma etching process using chemistries suitable for etching the first and second hardmasks 110, 112. For example, fluorocarbon precursors, such as any known $C_xH_yF_z$ (e.g., $CHF_3$, $CH_2F_2$, $CHF_3$, etc.) and/or any known $C_xF_y$ (e.g., $CF_4$, $C_2F_6$, $C_4F_8$, $C_4F_6$, $C_5F_8$, etc.) may be energized into a plasma to remove portions of the first and second hardmasks 110, 112 to form the recesses 202. A carrier gas, such as $N_2$ or an inert gas may also be provided during formation of the plasma.

The plasma may be formed by inductively coupled plasma techniques, capacitively coupled plasma techniques, and/or remote plasma techniques, depending upon desired plasma characteristics and hardware implementation. Generally, the precursors may be energized with a low frequency bias power RF generator, having a frequency below about 50 MHz, such as about 13.56 MHz. It is contemplated that the first etching process may be time dependent and may be performed for an amount of time sufficient to for the recesses and expose the material layers 104.

Figure 3:
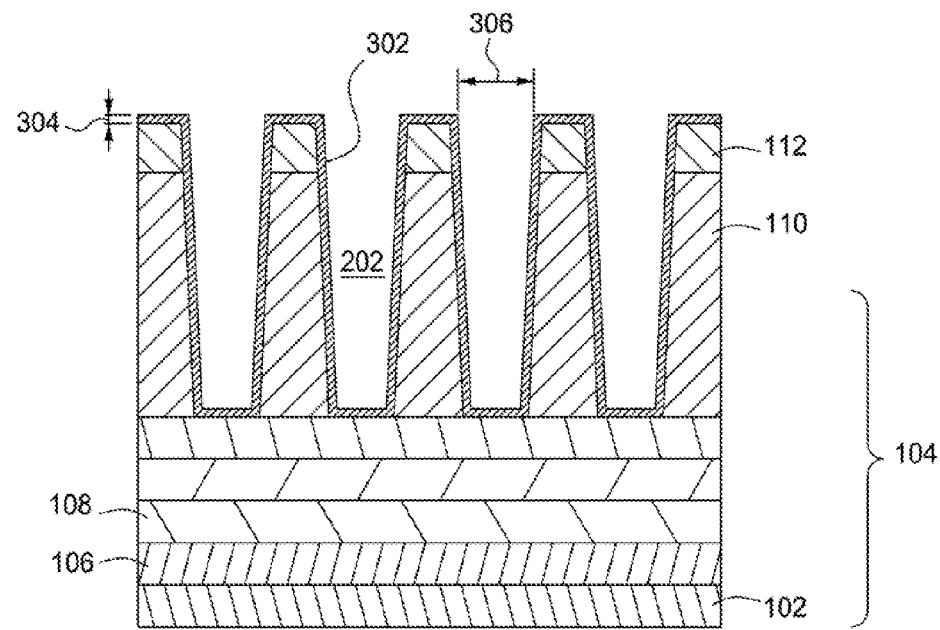
FIG. 3 illustrates a schematic, cross-sectional view of a portion of a substrate after conformally depositing a hardmask according to implementations described herein.

FIG. 3 illustrates a schematic, cross-sectional view of a portion of the substrate 102 after conformally depositing a third hardmask 302 according to implementations described herein. In certain implementations, the third hardmask 302 may be deposited with a conformality of greater than about 98%. As used herein, the term "conformal", or "conformally", refers to a layer that adheres to and uniformly covers exposed surfaces with a thickness 304 having a variation of less than 1% relative to the average thickness of the film. For example, a 1,000 Å thick film would have less than 10 Å variations in thickness. This thickness and variation includes edges, corners, sides, and the bottom of recesses.

In certain implementations, the thickness 304 of the third hardmask 302 may be between about 5 nm and about 15 nm, such as about 10 nm. Due to the conformality of the third hardmask 302, the third hardmask 302 may be deposited on various materials, such as the second hardmask 112, the first hardmask 110, and the material layers 104. A resulting CD 306 of the first and second hardmask features defined by the recess 202 may be between about 20 nm and about 100 nm, such as between about 50 nm and about 80 nm. Accordingly, a reduced CD may be realized by utilizing the third hardmask 302 in combination with the first and second hardmasks 110, 112.

The third hardmask 302, in certain implementations, may be a boron doped amorphous carbon material. As utilized herein, a boron doped carbonaceous material includes materials composed of at least 1 wt % boron and at least 20 wt % carbon. Included in this class of materials is boron-rich amorphous carbon, typically composed of greater than about 25 wt % boron and about 50 wt % carbon.

The third hardmask 302 may be formed with spray on/spin on methods, with a thermal deposition process (CVD), or a plasma enhanced deposition process (PECVD). In one implementation, the third hardmask 302 is deposited with either CVD or PECVD to form a carbon material composed of at least 50 wt % carbon with sp1, sp2, and sp3 bonding states giving the film properties which are a hybrid of those typical of pyrolytic, graphitic, and diamond-like carbon. In certain implementations, the third hardmask 302 may be formed with a PECVD process using hydrocarbon precursors, such as methane, propylene, propyne, propane, butane, butylenes, butadiene, acetylene, toluene, and mixtures thereof with a boron source, such as diborane and the like. The third hardmask 302 may also include nitrogen or other additives in certain implementations. An exemplary third hardmask material is commercially available from Applied Materials, Inc., Santa Clara, Calif., under the trade name Advanced Patterning Film™ (APF), and more specifically, a species of the APF genus of materials known as APFc, which is boron doped.

In implementations where the third hardmask 302 includes nitrogen, the material may be referred to as a borocarbonitride material. As used herein, the term "borocarbonitride" refers to a film comprising boron, carbon and nitrogen. In some implementations, the borocarbonitride film consists essentially of boron, carbon and nitrogen, meaning that boron, carbon and nitrogen make up at least about 80 atomic % of the film. In some implementations, the borocarbonitride film consists essentially of boron, carbon, nitrogen, and optionally, hydrogen atoms.

In one example, a borocarbonitride material may be deposited by a thermal CVD process using a dimethylamine borane [$(CH_3)_2NH.BH_3$] (DMAB) precursor. The DMAB may be heated in a hot can to increase the vapor pressure and may be delivered to a processing chamber using ultrahigh purity (UHP) Ar carrier gas. The hot can temperature may range from room temperature to about 150° C. The Ar carrier gas flow may range from about 100 sccm to about 20000 sccm. To control the elemental composition of the borocarbonitride film, $NH_3$, $H_2$, $C_3H_6$ co-reactant gases may be delivered to the CVD chamber. The chamber temperature may range from about 300° C. to about 550° C. Processing chamber pressure may range from about 100 mTorr to about 100 Torr. An example of a suitable process chamber for depositing the third hardmask 302 is the PRODUCER® family of processing apparatus available from Applied Materials, Inc., Santa Clara, Calif. However, it is contemplated that other chambers configured to deposit APF films from other manufacturers may also be utilized to conformally deposit the third hardmask 302.

Figure 4:
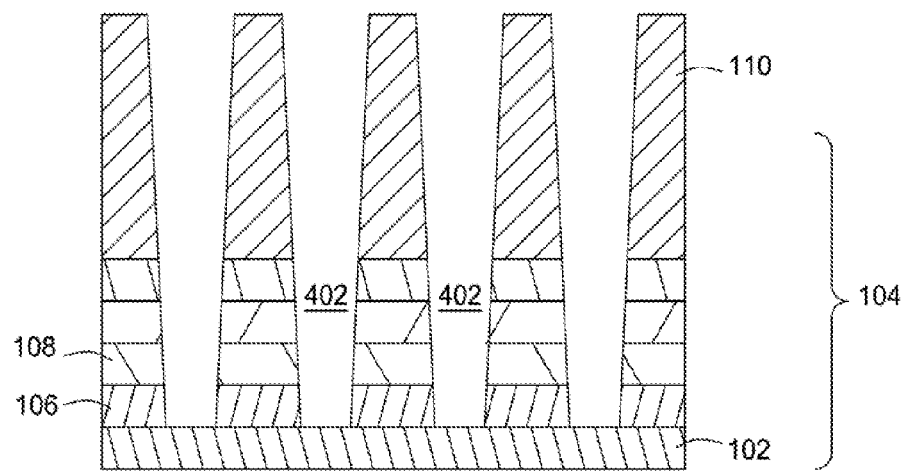
FIG. 4 illustrates a schematic, cross-sectional view of a portion of a substrate after performing a second etching process according to implementations described herein.

FIG. 4 illustrates a schematic, cross-sectional view of a portion of the substrate 102 after performing a second etching process according to implementations described herein. Generally, the second etching is configured to etch the material layers 104 to form channels 402 in the materials layers 104. The second hard mask 112 and the third hardmask 302 may also be removed during or after the second etching process. Improved material etching selectivity during the second etching process may also be realized by utilizing the third hardmask 302 in combination with the first hardmask 110. It is believed that hardmask removal characteristics may also be maintained by utilizing the hardmasks in combination with one another.

For example, the verticality profile of the channels 402 may be improved for advanced feature stacks due to the etch rate of the material layers 104 when compared to the etch rate of the third hardmask 302. In certain implementations, it is contemplated that the etch rate of the material layers 104 may be between about 3.5 and about 4.0 times greater than the etch rate of the third hardmask 302. Accordingly, upon removal of the third hardmask 302, a suitable depth and verticality profile of the channel 402 may be achieved.

The second etching process may be a plasma based etching process with a combination of $CH_4/N_2/O_2$ precursors and a fluorine-rich precursor, such as CHF, $CF_4$, $SF_6$, $C_2F_6$, and the like. The addition of the fluorine-rich source may facilitate removal of the boron in the third hardmask 302 while the $CH_4$ (and to a degree, the fluorocarbon precursors) precursor may predominantly facilitate removal of the oxide/nitride materials of the material layers 104. The $N_2$ and $O_2$ precursors may also facilitate ashing of the third hardmask 302 so that subsequent ashing processes are unnecessary. In other words, ashing of the third hardmask 302 (and the second hardmask 112) may be performed in-situ during the second etching process which forms the channels 402 in the material layers 104. Suitable apparatus for performing the second etching process include the ENABLER® etch chamber, the AdvantEdge G3 etch chamber, and the C3 etch chamber, all of which are available from Applied Materials, Inc., Santa Clara, Calif. It is contemplated that other suitably configured chambers from other manufacturers may also be utilized to perform the second etching process as described herein.

In summation, patterning process may be utilized to pattern the second hardmask 112 and a first etching process may be utilized to etch one or both of the first and second hardmasks 110, 112. After forming the recesses 202 in the first hardmask 110 during the first etching process, the third hardmask 302 may be conformally deposited over the material layers 104, the first hardmask 110, and the second hardmask 112. The second etching process may then be performed to form the channels 402 in the material layers 104 and to remove the second and third hardmasks 112, 302 from the substrate 102. Accordingly, improved channel characteristics, such as CD and verticality profile, and etching characteristics, such as selectivity, may be realized by utilizing the implementations described herein.

While the foregoing is directed to implementations of the present disclosure, other and further implementations of the disclosure may be devised without departing from the basic scope thereof, and the scope thereof is determined by the claims that follow.

What is claimed is:

1. A substrate processing method, comprising:
depositing a first hardmask on one or more material layers disposed on a substrate;
depositing a second hardmask on the first hardmask;
patterning the second hardmask;
performing a first etching process to etch the first hardmask and the second hardmask;
conformally depositing a third hardmask over the one or more material layers, the first hardmask, and the second hardmask, wherein the third hardmask comprises a boron doped carbonaceous material composed of greater than about 25 wt % boron and about 50 wt % carbon; and
performing a second etching process to etch the one or more material layers to form channels in the one or more material layers.

2. The method of claim 1, wherein the one or more material layers include silicon nitride materials and silicon oxide materials.

3. The method of claim 2, wherein the silicon nitride materials and the silicon oxide materials are deposited in alternating layers to form a layer stack.

4. The method of claim 3, wherein the layer stack has greater than about 48 material layers.

5. The method of claim 1, wherein the first hardmask is a carbon containing material.

6. The method of claim 5, wherein the first hardmask is deposited to a thickness of between about 1 μm and about 2 μm.

7. The method of claim 1, wherein the second hardmask is a dielectric material.

8. The method of claim 7, wherein the dielectric material is a silicon containing material.

9. The method of claim 8, wherein the silicon containing material is a silicon dioxide material, a silicon nitride material, a silicon oxynitride material, or combinations thereof.

10. The method of claim 7, wherein the second hardmask is deposited to a thickness of between about 50 μm and about 200 μm.

11. The method of claim 1, wherein the first etching process is a plasma etching process using fluorocarbon precursors.

12. The method of claim 1, wherein the third hardmask is conformally deposited to a thickness of between about 5 nm and about 15 nm.

13. The method of claim 1, wherein the boron doped carbonaceous material is a borocarbonitride material which includes nitrogen.

14. The method of claim 13, wherein at least about 80 atomic % of the borocarbonitride material is formed from boron, carbon, and nitrogen.

15. The method of claim 14, wherein the borocarbonitride material is deposited by a thermal chemical vapor deposition process using dimethylamine borane as a precursor.

16. A substrate processing method, comprising:
depositing a first hardmask on one or more oxide and nitride containing material layers disposed on a substrate;
depositing a second hardmask on the first hardmask;
performing a first etching process to etch the first hardmask and the second hardmask;
conformally depositing a borocarbonitride hardmask over the one or more oxide and nitride containing material layers, the first hardmask, and the second hardmask; and
performing a second etching process to etch the one or more oxide and nitride containing material layers to form channels in the one or more oxide and nitride containing material layers, wherein the second etching process is a plasma based etching process using precursors selected from the group consisting of $CH_4$, $N_2$, $O_2$, and a fluorine-rich precursor.

17. The method of claim 16, wherein the second etching process removes the second hardmask and the third hardmask.

18. A substrate processing method, comprising:
depositing a carbonaceous hardmask on one or more oxide and nitride containing material layers disposed on a substrate;
depositing a silicon containing dielectric hardmask on the carbonaceous hardmask;
performing a first etching process to etch the carbonaceous hardmask and the silicon containing dielectric hardmask;
conformally depositing a borocarbonitride hardmask over the one or more oxide and nitride containing material layers, the carbonaceous hardmask, and the silicon containing dielectric hardmask; and
performing a second etching process to etch the one or more oxide and nitride containing material layers to form channels in the one or more oxide and nitride containing material layers, wherein the second etching process is a plasma based etching process using precursors selected from the group consisting of $CH_4$, $N_2$, $O_2$, and a fluorine-rich precursor.

19. The method of claim 18, wherein an etch rate of the oxide and nitride containing material layers during the second etching process is about 3.5 to about 4.0 times greater than an etch rate of the borocarbonitride hardmask.

* * * * *